United States Patent
Katano et al.

(10) Patent No.: US 7,889,313 B2
(45) Date of Patent: Feb. 15, 2011

(54) IMMERSION LITHOGRAPHY APPARATUS AND EXPOSURE METHOD

(75) Inventors: Makiko Katano, Yokohama (JP); Takuya Kono, Yokosuka (JP); Ayako Mizuno, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 530 days.

(21) Appl. No.: 11/925,483

(22) Filed: Oct. 26, 2007

(65) Prior Publication Data

US 2008/0106713 A1    May 8, 2008

(30) Foreign Application Priority Data

Oct. 27, 2006    (JP) ............................. 2006-292228
Oct. 22, 2007    (JP) ............................. 2007-274032

(51) Int. Cl.
G03B 27/32    (2006.01)
G03B 27/42    (2006.01)
G03B 27/52    (2006.01)
G03B 27/58    (2006.01)
G03D 5/00    (2006.01)

(52) U.S. Cl. ............................. 355/30; 355/27; 355/53; 355/72; 355/77; 134/902; 396/611; 430/906

(58) Field of Classification Search .................... 355/30, 355/53, 77, 27, 72; 134/902; 250/492.2; 396/611; 438/906

See application file for complete search history.

(56) References Cited

U.S. PATENT DOCUMENTS

| 2007/0008507 A1 | 1/2007 | Kono et al. |
| 2007/0252960 A1* | 11/2007 | Kida ............................. 355/30 |
| 2008/0018868 A1* | 1/2008 | Yamamoto et al. ............ 355/30 |
| 2008/0055575 A1* | 3/2008 | Nagasaka et al. ............. 355/30 |

FOREIGN PATENT DOCUMENTS

WO    WO 2006/062188 A1    6/2006

* cited by examiner

Primary Examiner—Hung Henry Nguyen
Assistant Examiner—Colin Kreutzer
(74) Attorney, Agent, or Firm—Finnegan, Henderson, Farabow, Garrett & Dunner, L.L.P.

(57) ABSTRACT

An immersion lithography apparatus includes: a projection optical system which projects a pattern of a mask onto a substrate; a substrate cleaning unit which cleans the substrate prior to projection of the pattern; a liquid supply mechanism which supplies the same liquid to an immersion region between the projection optical system and the substrate and to the substrate cleaning unit; a first liquid discharge path through which the liquid discharged from the immersion region is passed; and a second liquid discharge path through which the liquid discharged from the substrate cleaning unit is passed.

6 Claims, 4 Drawing Sheets

IMMERSION LITHOGRAPHY APPARATUS AND EXPOSURE METHOD

CROSS REFERENCE TO RELATED APPLICATION

This application claims benefit of priority under 35USC §119 to Japanese patent applications No. 2006-292228, filed on Oct. 27, 2006, and No. 2007-274032, filed on Oct. 22, 2007, the contents of which are both incorporated by reference herein.

BACKGROUND OF THE INVENTION

1. Field of the Invention

The present invention relates to an immersion lithography apparatus and an exposure method.

2. Related Background Art

In an immersion lithography apparatus, a resist film or the like is formed on a processing target substrate, and then exposure is carried out while immersion fluid is flowed between the substrate and a lens (an optical element) of the lithography apparatus. As the immersion fluid, for example, pure water or pure water having a gas or a chemical added thereto as required is used. Since impurities in this pure water have various influences on an exposure step and the lithography apparatus, impurities concentration must be set to a fixed value or below. For example, it is known that an increase of an organic material concentration in the pure water would cause a temperature fluctuation during exposure to degrade image forming performance or deposition of the organic material onto a surface of the lens (the optical element) to provoke long-term illumination intensity unevenness/degradation or reduction of illumination intensity.

In the conventional immersion lithography apparatus, in order to manage impurities concentration in pure water that is introduced into the lithography apparatus, a pure water manufacturing unit is installed immediately before the lithography apparatus to monitor, e.g., a TOC (Total Organic Carbon) concentration, a dissolved gas concentration, or a specific resistance value in the pure water at an introduction opening leading to the lithography apparatus when a purity of the pure water to be supplied is insufficient.

Even though a purity of the pure water to be supplied is adequate, however, there occurs a problem that performance of a wetted lens of the lithography apparatus degrades or exposure performance degrades when impurities are eluted from the processing target substrate.

Although there is a conventional technology of performing pure water rinse to remove impurities before applying a resist to a wafer, or after applying the resist, or after forming a protective film, this pure water rinse is mainly implemented by using ordinary pure water in a resist application unit. As immersion fluid utilized in immersion exposure, pure water with a very high purity obtained by further removing impurities from pure water or pure water having a fixed gas or chemical added thereto is used. Therefore, solubility of impurities from the processing target substrate may be different from that of the ordinary pure water in some cases. Further, when the immersion fluid is used during immersion exposure processing, a pressure is applied to the resist or the protective film depending on conditions, e.g., a water pressure or a flow rate, and elution of impurities may be facilitated. Therefore, when immersion using ordinary pure water or cleaning using immersion fluid alone is performed, impurity elution during exposure may not be sufficiently reduced.

Furthermore, there is also a proposal of monitoring impurities in recovered water when immersion fluid is flowed on an exposure stage (e.g., WO 2006/062188). This is effective for monitoring impurities, but the impurities are already in contact with the lens when the impurities are detected during monitoring, and there is a problem that contamination of the lens advances.

SUMMARY OF THE INVENTION

According to a first aspect of the invention, there is provided an immersion lithography apparatus comprising:

a projection optical system which projects a pattern of a mask onto a substrate;

a liquid supply path through which a liquid is passed to be supplied to an immersion region between the projection optical system and the substrate;

a liquid discharge path through which the liquid discharged from the immersion region is passed;

a first measurement unit which is arranged in the liquid discharge path and measures impurities dissolved in the liquid;

a first control unit which compares a measurement result obtained by the first measurement unit with a preset threshold value, and interrupts exposure when the measurement result exceeds the threshold value;

a substrate cleaning unit which has a cleaning liquid discharge path and cleans the substrate prior to projection of the mask pattern;

a second measurement unit which is arranged in the cleaning liquid discharge path and measures impurities dissolved in the cleaning liquid; and a second control unit which compares a measurement result obtained by the second measurement unit with a preset value, and allows the substrate cleaning unit to clean the substrate until the measurement result reaches the set value.

According to a second aspect of the invention, there is provided an immersion lithography apparatus comprising:

a projection optical system which projects a pattern of a mask onto a substrate;

a substrate cleaning unit which cleans the substrate prior to projection of the pattern;

a liquid supply mechanism which supplies the same liquid to an immersion region between the projection optical system and the substrate and to the substrate cleaning unit;

a first liquid discharge path through which the liquid discharged from the immersion region is passed; and a second liquid discharge path through which the liquid discharged from the substrate cleaning unit is passed.

According to a third aspect of the invention, there is provided an exposure method of a substrate by using an immersion lithography apparatus which projects an image of a pattern of a mask onto a substrate through a liquid, the method comprising:

cleaning a substrate to be exposed with the same liquid as a liquid which is supplied to an immersion region between a projection optical system of the immersion lithography apparatus and the substrate prior to projection of the pattern.

BRIEF DESCRIPTION OF THE DRAWINGS

In accompanying drawings.

DETAILED DESCRIPTION OF THE INVENTION

Figure 1:
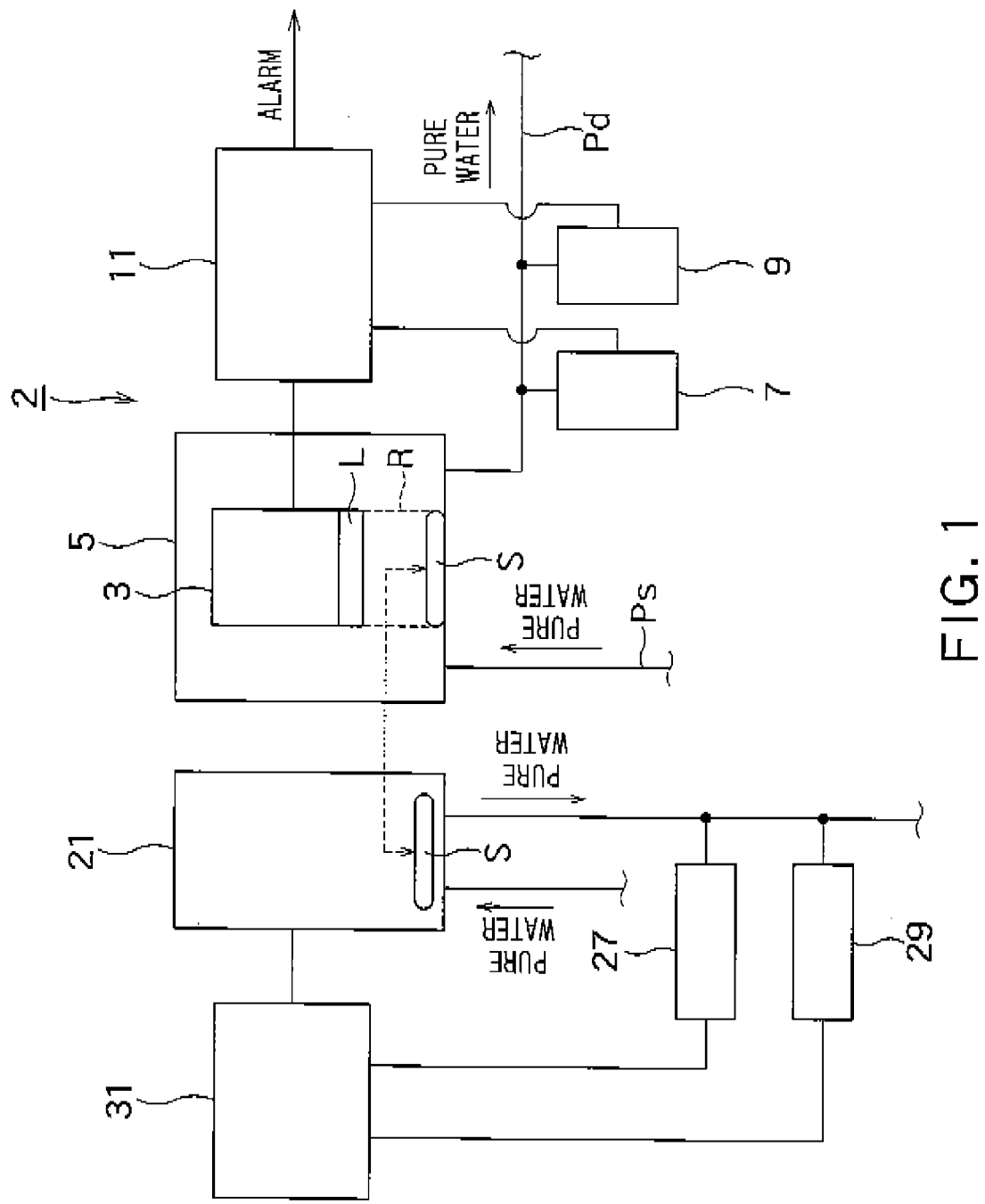
FIG. 1 is a block diagram showing an outline structure of an immersion lithography apparatus according to a first embodiment of the present invention.

Several embodiments according to the present invention will now be explained with reference to the accompanying drawings. It is to be noted that like reference numerals denote like parts in the respective drawings, thereby appropriately omitting a tautological explanation thereof.

(1) First Embodiment

FIG. 1 is a block diagram showing an outline structure of an immersion lithography apparatus according to a first embodiment of the present invention. An immersion lithography apparatus 2 depicted in FIG. 1 comprises a column 5, a TOC meter 7, a specific resistance meter 9, a control section 11, a substrate cleaning unit 21, a TOC meter 27, a specific resistance meter 29 and a control section 31. The column 5 accommodates a projection optical system 3 including a wetted lens L as an optical element. A processing target substrate S is disposed at a position where it faces the wetted lens L in the column 5. A space between the processing target substrate S and the wetted lens L forms an immersion region R, and an image of a pattern of a mask (not shown) is projected onto the substrate S through pure water (immersion fluid) supplied from a liquid supply path Ps, thereby exposing the processing target substrate S.

The TOC meter 7 is arranged in a liquid discharge path Pd and measures impurities concentration in discharged pure water caused due to deposition of, e.g., an organic material from the processing target substrate S during an exposure process. The specific resistance meter 9 is also arranged in the liquid discharge path Pd and measures a specific resistance of the discharged pure water. The TOC meter 7 and the specific resistance meter 9 are connected with the control section 11 to transmit their measurement results, respectively. The TOC meter 7 and the specific resistance meter 9 correspond to, e.g., a first measurement unit in this embodiment.

The control section 11 is also connected with the projection optical system 3 and transmits a control signal to the projection optical system 3. The control section 11 receives respective measurement results from the TOC meter 7 and the specific resistance meter 9 and compares these results with respective preset threshold values. When the measurement results exceed the threshold values, the control section 11 outputs an alarm signal, stops exposure processing, and cleans at least one of the processing target substrate S and the wetted lens L.

More specifically, the control section 11 adds a cleaning step using pure water before exposure with respect to the processing target substrate S in a lot that is a target of the alarm, and also applies feedback, e.g., prolonging a cleaning time to prevent a defect from occurring in the remaining processing target substrates S. In regard to the processing target substrate S which has been through the exposure step, the exposed pattern is inspected. When an inspection result is indicative of a fair quality, performing the remaining manufacturing process can suffice. When an inspection result is indicative of a poor quality, rework processing is performed if the rework processing is possible. If a result of a follow-up inspection is indicative of a fair quality, the remaining manufacturing process is executed. On the other hand, if the rework processing is impossible, the processing target substrate S which has been proved to be a poor product is discarded.

Impurities which have been absorbed to the wetted lens L is washed off by using pure water or a cleaning liquid, thereby suppressing deposition of the impurities. As a result, performance of the wetted lens L can be recovered, thus avoiding degradation in exposure performance.

The substrate cleaning unit 21 cleans the processing target substrate 2 by using the pure water as pre-processing of exposure. Both the TOC meter 27 and the specific resistance meter 29 are arranged in a drainage line of a pure water cleaning tank (not shown) of the substrate cleaning unit 21. The TOC meter 27 measures impurities concentration in discharged water and the specific resistance meter 9 measures a specific resistance in the discharged water. The TOC meter 27 and the specific resistance meter 29 are connected with the control section 31 to transmit their measurement results, respectively. The TOC meter 27 and the specific resistance meter 29 correspond to, e.g., a second measurement unit in this embodiment.

The control section 31 is also connected with the substrate cleaning unit 21 and transmits a control signal to the substrate cleaning unit 21. The control section 31 receives respective measurement results from the TOC meter 27 and the specific resistance meter 29, compares these results with respective preset values, and operates the substrate cleaning unit 21 to clean the processing target substrate S until the measurement results reach the set values. As a result, a large amount of impurities from the processing target substrate can be prevented from being eluted. However, since an amount of the pure water used for cleaning is higher than an amount of the pure water (the immersion fluid) used during exposure by a single digit or more, a monitoring sensitivity is lowered by a single digit or more, and managing a very small amount of eluted impurities is difficult.

In this embodiment, a TOC is measured, and then a specific resistance is measured. Conversely, the TOC may be measured after measuring the specific resistance. However, when a TOC value is abnormal, since continuing exposure while leaving this abnormal value results in occurrence of an exposure defect from degradation in image forming performance, a possibility that the processing target substrate S becomes a defective product is increased. Therefore, it is preferable to measure the TOC before the specific resistance and immediately stop exposure when the measured TOC value exceeds a threshold value.

When the TOC value that may highly possibly produce a defective product due to degradation in image forming performance owing to abnormality thereof is measured in preference to other indices in this manner, whether the processing target substrate S is a defective product can be judged on an earlier stage in the aftermath of start of exposure or restart of exposure after occurrence of the abnormality. Therefore, when rework processing is impossible, the number of the processing target substrates S to be discarded can be reduced. Measuring the TOC before other indices has an effect of particularly contributing to an improvement in a yield ratio of device manufacture.

(2) Second Embodiment

A second embodiment according to the present invention will now be explained with reference to FIGS. 2 and 3. This embodiment is characterized in that a substrate cleaning unit 41 is provided on a front stage of a column 5 accommodating a projection optical system 3 and a substrate S is cleaned by using the same liquid as a liquid supplied to an immersion region prior to exposure of a mask pattern with respect to the substrate S.

Figure 2:
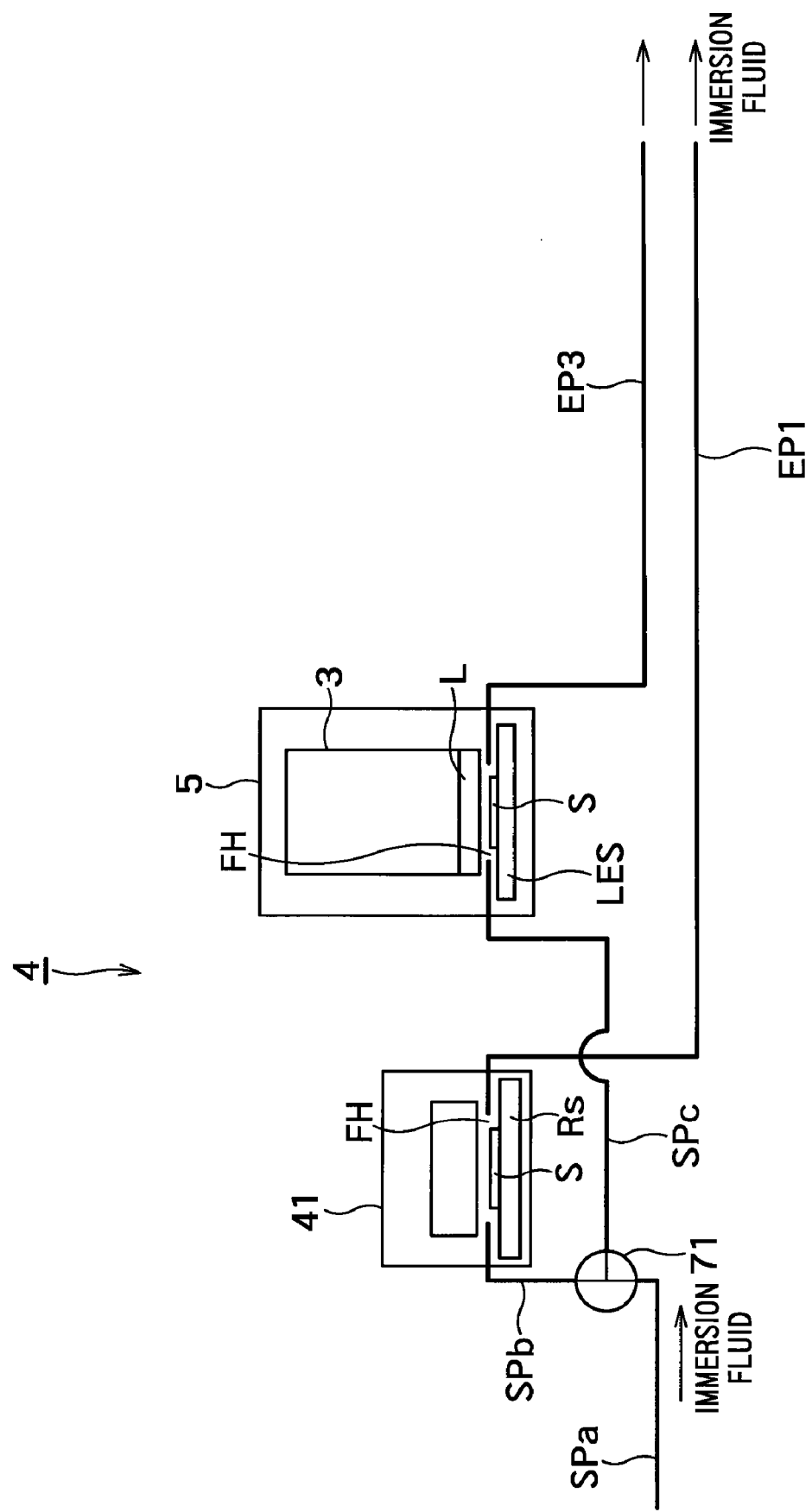
FIG. 2 is a block diagram showing an outline structure of an immersion lithography apparatus according to a second embodiment of the present invention.
Figure 3:
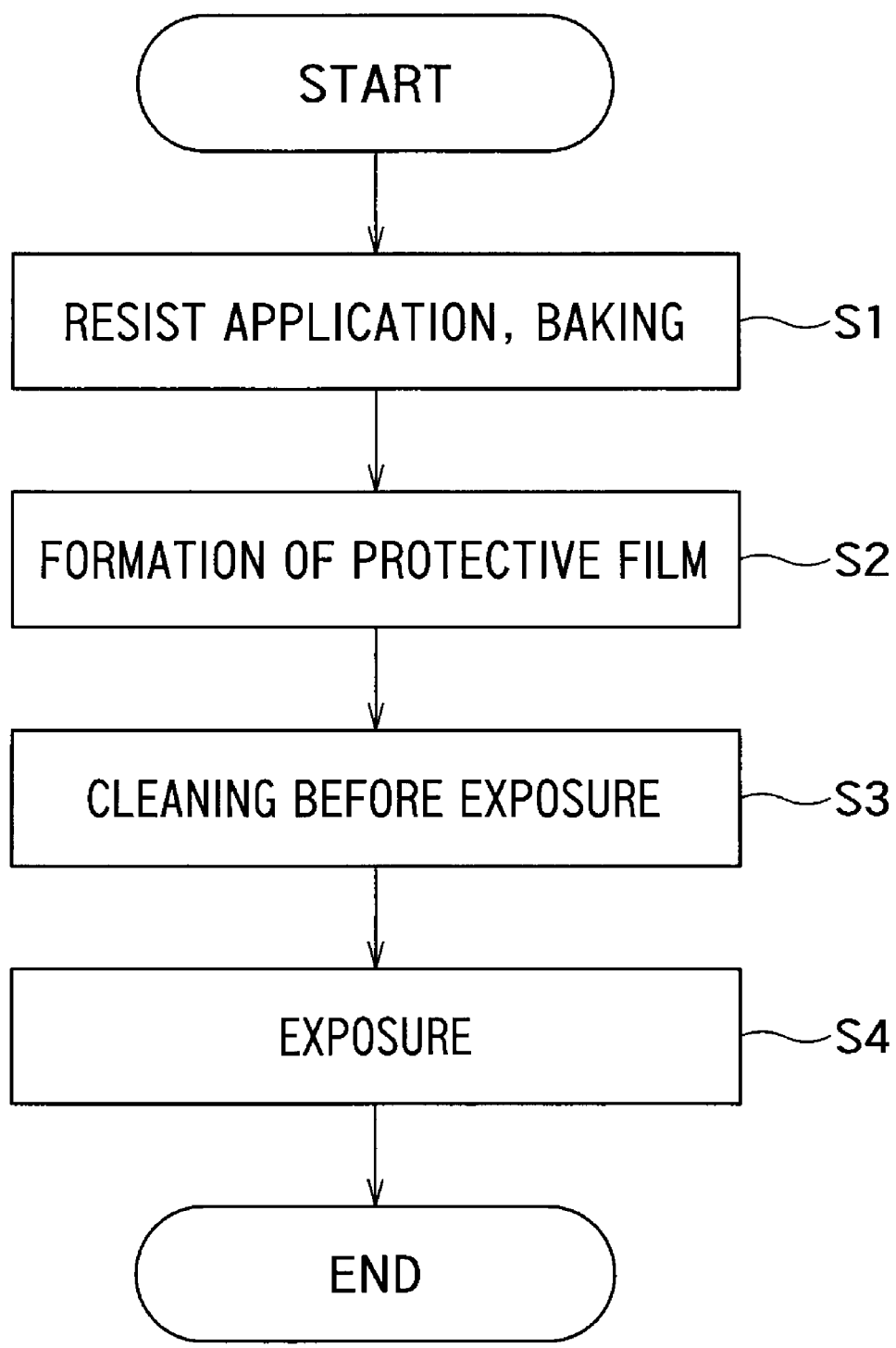
FIG. 3 is a flowchart showing a processing flow according to the second embodiment of the present invention.

FIG. 2 is a block diagram showing an outline structure of a lithography apparatus 4 according to this embodiment. As shown in this drawing, the lithography apparatus 4 comprises the column 5, the substrate cleaning unit 41, immersion fluid supply pipes SPa to SPc, and immersion fluid discharge pipes EP 1 and EP 3. Immersion fluid passing through the immersion fluid supply pipe SPa is divided at a dividing portion 71 to be supplied to the substrate cleaning unit 41 and an immersion region R of the column 5 through the immersion fluid supply pipes SPb and SPc. The immersion fluid supplied to the substrate cleaning unit 41 flows on a surface of the substrate S disposed on a cleaning stage RS of the substrate cleaning unit 41 for a fixed time prior to exposure of a mask pattern, thereby cleaning the substrate S. The cleaned substrate S is moved to the column 5, mounted on an exposure stage LES, and subjected to immersion exposure processing. At this time, the substrate S that is exposed next in the same lot is carried into the cleaning unit 41 for a cleaning process before exposure. In this embodiment, the immersion fluid supply pipes SPa to SPc and the dividing portion 71 correspond to, e.g., a liquid supply mechanism.

Previously cleaning the substrate S before exposure in this manner enables reducing elution of impurities from the substrate at the time of exposure.

A processing flow according to this embodiment will now be explained with reference to a flowchart of FIG. 3.

First, processing, e.g., application of a resist or baking is performed with respect to the processing target substrate S (a step S1).

Then, an immersion protective film is formed on a resist film (a step S2).

Subsequently, the processing target substrate S is first disposed on the cleaning stage RS of the substrate cleaning unit 41 in the immersion lithography apparatus 4 and cleaned by using the immersion fluid supplied through the immersion fluid supply pipes SPa and SPc (a step S3).

Thereafter, the cleaned substrate S is mounted on the exposure stage LES in the column 5 to be subjected to immersion exposure processing (a step S4).

As main factors of elution of impurities into the immersion fluid at the time of exposure, the following four points can be considered. That is, 1. Impurities that have d to a wafer surface after formation of the protective film is dissolved;

2. Impurities that have d to a process wafer from the beginning is eluted through the resist or the protective film;

3. Impurities in the protective film or the resist film are eluted; and

4. A component in the protective film or the resist film is dissolved, or decomposed and eluted.

It can be considered that these elution characteristics vary depending on property of fluid used for cleaning. When fluid having different property is used for cleaning of a wafer and for an immersion flow, impurities may be possibly newly eluted during immersion processing. Since the same water as the immersion fluid is used for cleaning in this embodiment, elution of the impurities during immersion processing can be effectively suppressed. As a result, an exposure defect caused due to a dissolved material in the immersion fluid can be avoided, a yield ratio of device manufacture can be improved, and a frequency of maintenance, e.g., replacement of the lens L or cleaning can be reduced.

The same immersion fluid supply heads FH are respectively provided on the cleaning stage RS and the exposure stage LES in accordance with an exposure target region of the substrate, and the immersion fluid flows on the substrate S on the cleaning stage RS with the same flow velocity and the same pressure as those in exposure. Since elution characteristics of an insoluble matter from the substrate S differ depending on a flow velocity or a pressure of the immersion fluid, performing cleaning under the same conditions as those in exposure enables effectively suppressing elution of the insoluble matter at the time of exposure. In this embodiment, the flow water supply heads FH constitute, e.g., flow velocity/pressure controlling means.

(3) Third Embodiment

Figure 4:
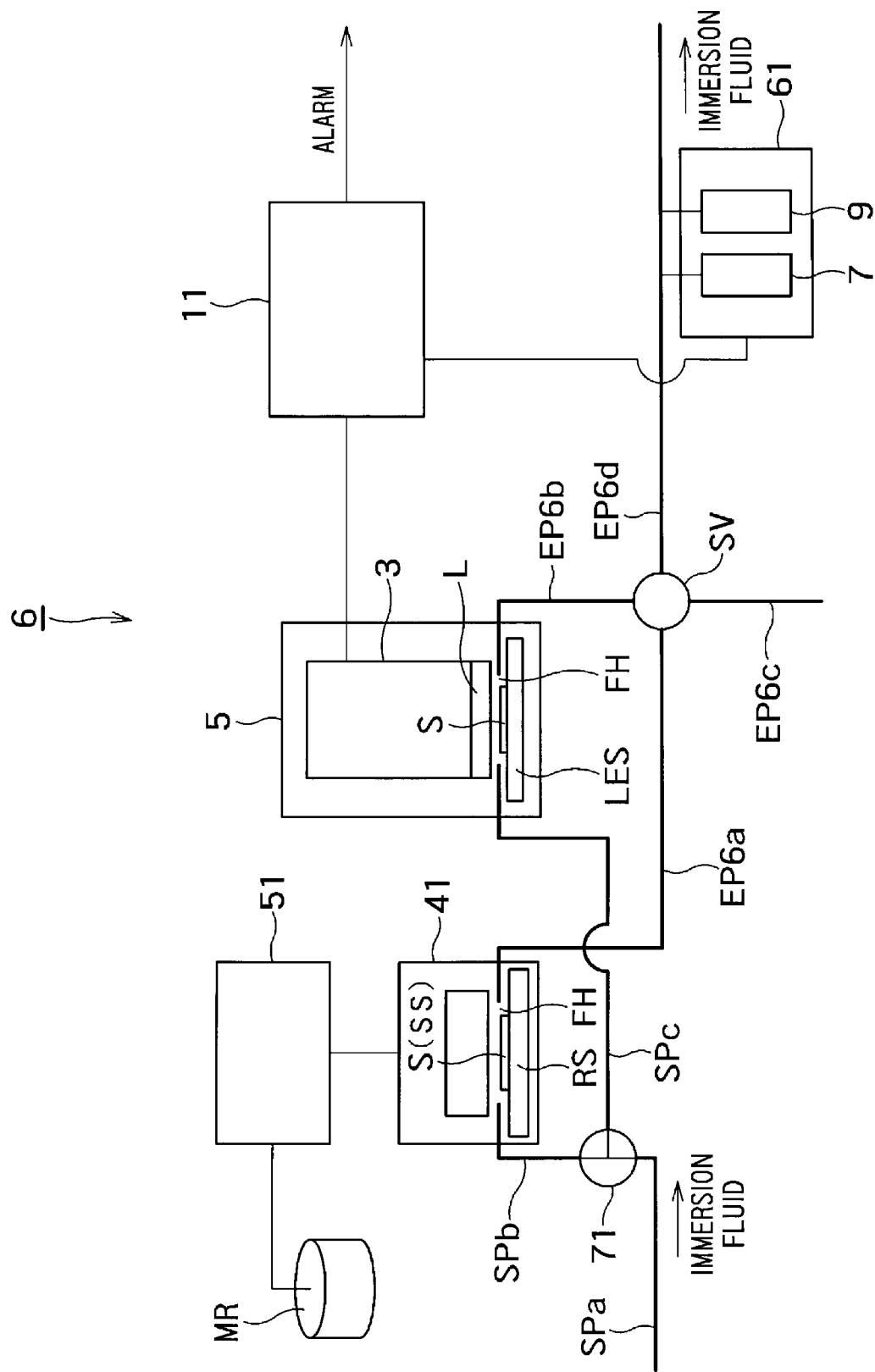
FIG. 4 is a block diagram showing an outline structure of an immersion lithography apparatus according to a third embodiment of the present invention.

FIG. 4 is a block diagram showing an outline structure of a lithography apparatus according to a third embodiment of the present invention. A lithography apparatus 6 shown in FIG. 4 comprises a column 5, a substrate cleaning unit 41 provided on an upstream side of the column 5 and immersion fluid supply pipes SPa to SPc and also comprises a control unit 11 that controls the column 5, a control unit 51 that controls the substrate cleaning unit 41, and a memory MR. The memory MR is connected with the control unit 51 and accommodates a recipe file in which a substrate cleaning process according to a later-explained procedure is written.

The lithography apparatus 6 further comprises immersion fluid discharge pipes EP 6a to 6d in place of the immersion fluid discharge pipes EP 1 and EP 3 included in the lithography apparatus 4 depicted in FIG. 2. The immersion fluid discharge pipe EP 6a is connected with a immersion fluid supply head FH of the substrate cleaning unit 41 to discharge the immersion fluid after cleaning, and the immersion fluid discharge pipe EP 6b is connected with a immersion fluid supply head FH of the column 5 to discharge the immersion fluid therefrom. The immersion fluid discharge pipes EP 6a and EP 6b are connected with the immersion fluid discharge pipes EP 6c and EP 6d through a switching valve SV, and a path of the immersion fluid that has passed through the immersion fluid discharge pipes EP 6a and E 6b is selected by the switching valve SV so that the immersion fluid can pass through both the immersion fluid discharge pipes EP 6c and EP 6d.

Furthermore, impurities measuring unit 61 is connected with the immersion fluid discharge pipe EP 6d so that impurities in both the immersion fluid from the substrate cleaning unit 41 and the immersion fluid from the column 5 can be monitored.

Although FIG. 4 shows an embodiment in which the impurity measurement unit 61 includes a TOC meter 7 and a specific resistance meter 9, the present invention is not restricted thereto, and a metal impurity measurement device, an Si concentration measurement device, or an ion concentration measurement device can be used, for example.

An exposure method using the lithography apparatus 4 depicted in FIG. 4 will now be explained hereinafter.

1. Pre-Processing

First, the switching valve SV is operated to select a path so that the immersion fluid from the substrate cleaning unit 41 can pass through the immersion fluid discharge pipe EP 6d.

Then, a substrate SS as a sample is mounted on a cleaning stage of the substrate cleaning unit 41 in accordance with each processing target substrate S under new process conditions, cleaning is carried out, impurities in a waste liquid are monitored by the impurity measurement unit 61, optimum cleaning conditions are determined from a result of monitoring with respect to a time required until elution of the impurities from the substrate SS is converged or a flow quantity of the immersion fluid. That is because cleaning conditions, e.g., a time required until elution of impurities from the substrate SS is completed or a flow quantity of the immersion fluid vary depending on contents of an etching process, e.g., a material or a composition of the substrate SS, a resist underlying film, types or applying conditions of a resist and a protective film, and others.

Then, a correspondence relationship between the obtained optimum cleaning conditions and exposure process conditions is stored in a data table to create a cleaning recipe, and the created cleaning recipe is stored in the memory MR.

2. Cleaning Processing

Thereafter, the control advances to exposure processing, and data of exposure process conditions concerning the processing target substrate S under the new process conditions is input to the control unit through a non-illustrated I/O. When the control unit 51 reads the cleaning recipe from the memory MR, optimum cleaning conditions concerning the processing target substrate S are determined by making reference to the data table, and the processing target substrate S is cleaned under the determined cleaning conditions. The processing target substrate S subjected to cleaning is moved to the exposure stage LES of the column 5, and immersion exposure processing is then performed. During exposure, the switching valve SV is changed over to select a drainage path so that the immersion fluid that has passed through the immersion fluid discharge pipe EP 6b from the column 5 can pass through the immersion fluid discharge pipe EP 6d, and the impurity measurement unit 61 measure impurities. When a measurement result exceeds a preset threshold value, an alarm is generated to interrupt the exposure processing, the cleaning conditions are reviewed.

As explained above, according to this embodiment, the optimum cleaning conditions are determined prior to immersion exposure, and the processing target substrate is cleaned under the determined conditions, thereby avoiding a trouble that a lens L in the column 5 is contaminated.

Although the embodiments according to the present invention have been explained above, the present invention is not restricted thereto and it can be of course modified and applied in many ways within a technical scope thereof.

Although the example where both the TOC meter and the specific resistance meter are provided has been explained in the foregoing embodiments, one of these members may be used in accordance with an exposure step and required specifications.

What is claimed is:

1. An immersion lithography apparatus comprising:
    a projection optical system which projects a pattern of a mask onto a substrate;
    a substrate cleaning unit which is located upstream of the projection optical system and cleans the substrate prior to projection of the pattern;
    a liquid supply mechanism which supplies the same liquid to an immersion region between the projection optical system and the substrate and to the substrate cleaning unit;
    a first liquid discharge path through which the liquid discharged from the immersion region is passed;
    a second liquid discharge path through which the liquid discharged from the substrate cleaning unit is passed; and
    identical flow velocity/pressure control units provided in the immersion region between the projection optical system and the substrate and in the substrate cleaning unit.

2. The immersion lithography apparatus according to claim 1, further comprising:
    an impurities measurement unit which is arranged in the second liquid discharge path and measures impurities in the liquid discharged from the substrate cleaning unit; and
    a control unit which controls the substrate cleaning unit on the basis of a measurement result obtained by the impurities measurement unit and a correspondence relationship between previously acquired process conditions and cleaning conditions.

3. An exposure method of exposing a substrate by using an immersion lithography apparatus which projects an image of a pattern of a mask onto a substrate through a liquid, the method comprising:
    cleaning a substrate to be exposed with the same liquid as a liquid which is supplied to an immersion region between a projection optical system of the immersion lithography apparatus and the substrate prior to projection of the pattern, in a region other than the immersion region,
    wherein cleaning the substrate is carried out with the same flow velocity and under the same pressure as a flow velocity and a pressure of the liquid which is supplied to the immersion region at the time of projection of the pattern.

4. The exposure method according to claim 3, further comprising:
    measuring first impurities dissolved in the liquid after cleaning the substrate to be exposed;
    obtaining a correspondence relationship between process conditions and cleaning conditions from a measurement result of the first impurities dissolved in the liquid after cleaning; and
    determining an optimum cleaning condition by applying a specific process condition to the obtained correspondence relationship, and cleaning under the optimum cleaning condition a processing target substrate with the same liquid as the liquid which is supplied to the immersion region prior to projection of the pattern.

5. The exposure method according to claim 4, further comprising:
    measuring second impurities dissolved in the cleaning liquid discharged from the immersion lithography apparatus; and
    comparing a measurement result obtained by measuring the second impurities with a preset threshold value, and reviewing the cleaning conditions when the measurement result of the second impurities reaches the threshold value.

6. The exposure method according to claim 5,
    wherein a TOC value is measured in preference to other indices as the second impurities.

* * * * *